United States Patent

Bae

[11] Patent Number: 5,817,445
[45] Date of Patent: Oct. 6, 1998

[54] METHOD FOR INSPECTING PROCESS DEFECTS OCCURRING IN SEMICONDUCTOR DEVICES

[75] Inventor: Sang Man Bae, Ichon-shi, Rep. of Korea

[73] Assignee: Hyundai Electronics Industries, Co., Ltd., Ichon-shi, Rep. of Korea

[21] Appl. No.: 725,176

[22] Filed: Oct. 3, 1996

[30] Foreign Application Priority Data

Oct. 4, 1995 [KR] Rep. of Korea .................. 95-33875

[51] Int. Cl.[6] .................................................. G03F 7/20
[52] U.S. Cl. ........................ 430/312; 430/30; 430/316; 430/394; 430/396
[58] Field of Search ........................ 430/30, 312, 313, 430/316, 394, 396

[56] References Cited

U.S. PATENT DOCUMENTS

| | | | |
|---|---|---|---|
| 5,087,537 | 2/1992 | Conway et al. | 430/15 |
| 5,447,810 | 9/1995 | Chen et al. | 430/5 |
| 5,506,080 | 4/1996 | Adair | 430/5 |
| 5,667,940 | 9/1997 | Hsue | 430/312 |

*Primary Examiner*—Kathleen Duda
*Attorney, Agent, or Firm*—Reid & Priest, LLP.

[57] ABSTRACT

A method for inspecting process defects occurring in a semiconductor device, which utilizes the phenomenon that even when photo shield film patterns are used, patterns of an etchable layer have different dimensions at different positions in a field region. A first etchable layer is patterned using positive photoresist film patterns. Patterns of a negative photoresist film is then formed on the first etchable layer under the condition in which the substrate is misaligned from the light exposure mask by a distance corresponding to either "(n+½)×pitch" or "(n+¼)×pitch" (n: a natural number) upon conducting a secondary light exposure for the formation of those patterns. The first etchable layer is then patterned using the negative photoresist film patterns in the form of remaining layers. The defect inspection device measures positions, density and dimensions of the remaining layer portions of the first etchable layer. Accordingly, it is possible to quantitatively measure the difference in critical dimension of the patterns at different positions in the field region. The measured values are fed back to correct an error occurring in the photo shield film patterns of the light exposure mask.

7 Claims, 3 Drawing Sheets

METHOD FOR INSPECTING PROCESS DEFECTS OCCURRING IN SEMICONDUCTOR DEVICES

BACKGROUND OF THE INVENTION

1. Field of the Invention

The present invention relates to a method for inspecting process defects occurring in a semiconductor device, and more particularly to a method for inspecting process defects occurring in a semiconductor device, which can form positive photoresist film patterns and negative photoresist film patterns, based on a phenomenon that even when a light exposure process is conducted using photo shield film patterns having the same dimension to pattern a photoresist film, patterns of the photoresist film have different dimensions at different positions in a region (namely, a field region) where the photoresist film is exposed to light upon conducting the light exposure process once.

2. Description of the Prior Art

Generally, process defects involved in semiconductor devices affect the reliability and yield of those semiconductor devices considerably. Accordingly, it is necessary to conduct a defect inspection during an interval between successive processing steps in the fabrication of semiconductor devices.

The lithography process used in the fabrication of semiconductor devices involves a proximity effect in that even when a light exposure mask provided with photo shield film patterns having the same dimension is used, patterns formed on a wafer have different dimensions due to a variation in the diffraction rate of light passing through the light exposure mask depending on the density of photo shield film patterns of the light exposure mask and an interference between light beams respectively passing through adjacent patterns of the light exposure mask. In order to form patterns having a desired dimension, taking into consideration such a proximity effect, patterns are first formed on a substrate using a light exposure mask provided with photo shield film patterns having the same dimension, and a difference in critical dimension of those patterns resulting from a proximity effect is then detected. The detected value is fed back to form a light exposure mask provided with photo shield film patterns having different dimensions capable of compensating for the difference in critical dimension.

In the case of highly integrated memory devices such as DRAM's of 64 Mega-grade or greater or ASIC devices having lines of various dimensions, however, it is impractical to compensate for a difference in critical dimension in the above-mentioned manner because those devices have a very large number of patterns requiring complex and huge calculation.

For this reason, formation of patterns is conducted while ignoring the above-mentioned proximity effect or compensating for particular pattern portions in accordance with conventional methods.

In accordance with such conventional methods, however, process defects occur in various portions of a semiconductor device as finally obtained because the calculation and compensation for a difference in critical dimension is not conducted for all patterns of the device, but rather, is conducted for a part of the patterns. Such a problem becomes more severe when the semiconductor device has a highly integrated structure or has patterns with various dimensions. As a result, a degradation in process yield occurs. Moreover, a lot of time is taken for the compensation, thereby increasing the manufacturing cost.

SUMMARY OF THE INVENTION

Therefore, an object of the invention is to solve the above-mentioned problems and to provide a method for inspecting process defects occurring in a semiconductor device, which detects the density and dimensions of highly-reflective etchable layer patterns left on a semiconductor substrate due to a difference in critical dimension between different portions of a light exposure mask as used, by utilizing the phenomenon that even when a light exposure process is conducted using photo shield film patterns having the same dimension to pattern a photoresist film, patterns of the photoresist film have different dimensions at different positions in the field region, so that an improvement in process yield and operation reliability can be obtained, thereby reducing the manufacturing cost.

In accordance with the present invention, this object is accomplished through a method for inspecting process defects occurring in a semiconductor device, comprising the steps of: forming a first etchable layer over a semiconductor substrate; forming a positive photoresist film over the first etchable layer; exposing the positive photoresist film to light by use of a light exposure mask having line/space patterns of a photo shield film, thereby forming patterns of the positive photoresist film in such a manner that the positive photoresist film patterns have different dimensions at different positions in a field region by virtue of a proximity effect; etching the first etchable layer by use of the positive photoresist film patterns as a mask, thereby forming patterns of the first etchable layer pattern, and removing the positive photoresist film patterns; forming a negative photoresist film over the entire upper surface of the resulting structure obtained after the removal of the positive photoresist film patterns; exposing the negative photoresist film while shifting the light exposure mask by a desired distance in such a manner that the photo shield film patterns are misaligned from the corresponding first etchable layer patterns, thereby forming patterns of the negative photoresist film; forming patterns of a second etchable layer exhibiting a difference in etch selectivity from the first etchable layer while partially exposing the negative photoresist film patterns; removing the exposed negative photoresist film patterns, thereby exposing portions of the first etchable layer disposed beneath the removed negative photoresist film patterns; removing the exposed portions of the first etchable layer, thereby leaving the portions of the first etchable layer disposed beneath the second etchable layer patterns as remaining layers; removing the second etchable layer patterns; and inspecting the resulting structure obtained after the removal of the second etchable layer patterns to detect the remaining layers to inspect the density and dimensions of the detected remaining layers, thereby calculating a difference in critical dimension involved in the light exposure mask based on the result of the inspection.

In accordance with this method, it is possible to quantitatively measure the difference in critical dimension of the patterns at different positions in the field region. The measured values are fed back to correct an error occurring in the photo shield film patterns of the light exposure mask. Accordingly, it is possible to reduce the time taken for the inspection of process defects.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
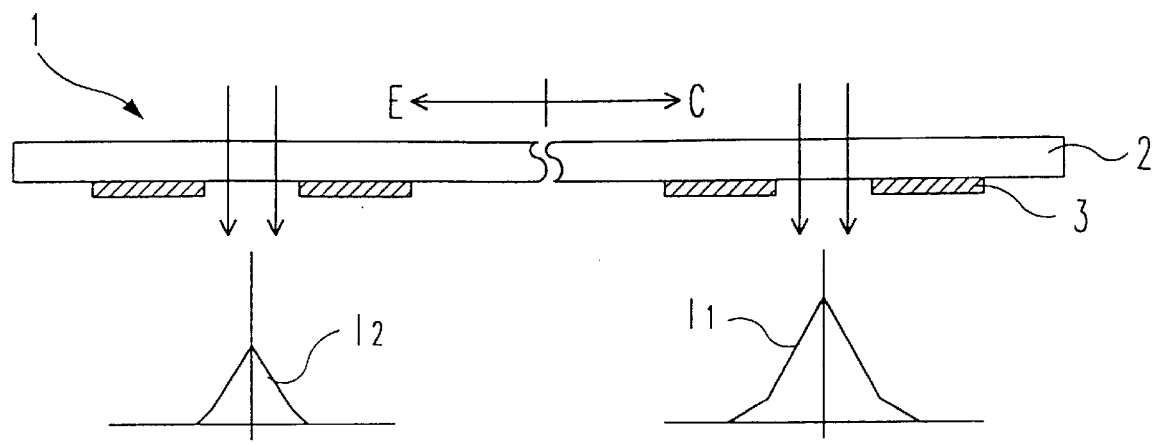
FIG. 1 is a schematic view illustrating a variation in intensity of light depending on the position of a light exposure mask.
Figure 2:
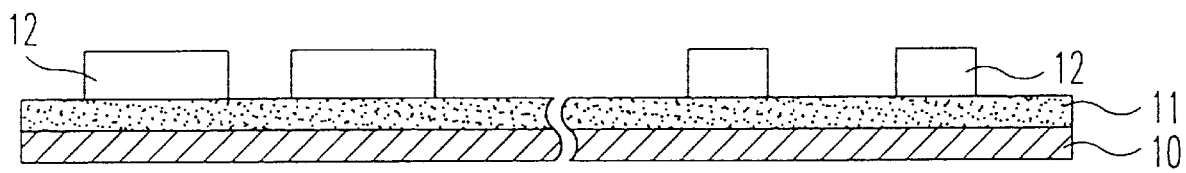
FIG. 2 is a sectional view illustrating a semiconductor device formed with positive photoresist film patterns using the light exposure mask of FIG. 1.
Figure 3:
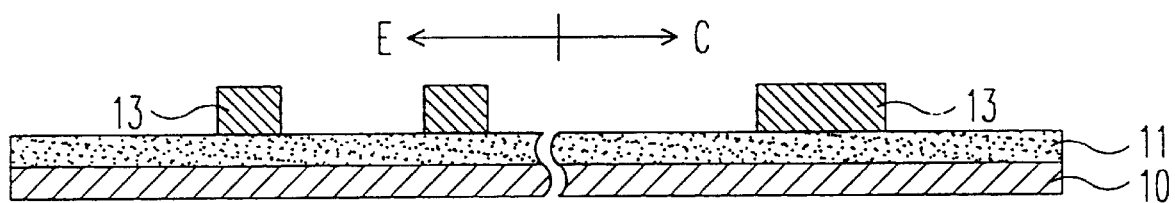
FIG. 3 is a sectional view illustrating a semiconductor device formed with negative photoresist film patterns using the light exposure mask of FIG. 1.

FIGS. 1 to 3 are views explaining the principle of a method for inspecting process defects occurring in a semiconductor device in accordance with the present invention, respectively. This principle will be described in conjunction with FIGS. 1 to 3.

Referring to FIG. 1, a light exposure mask 1 is shown, which includes a transparent substrate 2 made of quartz or glass. The light exposure mask 1 also includes a plurality of photo shield film patterns 3 formed on the transparent substrate 2. The photo shield film patterns 3 have the same lines/spaces and are comprised of a chromium layer.

The light exposure mask 1 exhibits different intensities and widths of transmitting light due to the difference in critical dimension between different portions of the light exposure mask 1, for example, central and edge portions C and E of the field region. Such differences in intensity and width depends on the kind of the lens which is used, the density of the patterns and the degree of defocus or the energy of exposure light as used.

Where the above-mentioned light exposure mask 1 is used, patterns are formed in such a manner that they have different dimensions at different positions thereof.

In other words, an etchable material is coated over a semiconductor substrate 10 to form an etchable layer 11. A positive photoresist film 12 and a negative photoresist film 13 are then sequentially formed over the etchable layer 11. After patterning these photoresist films 12 and 13 using the light exposure mask 1, patterns are formed which have different dimensions due to a difference in critical dimension involved in the light exposure mask, as shown in FIGS. 2 and 3. The present invention forms a pattern enabling an inspection of process defects by utilizing such a property.

FIGS. 4A to 4E are sectional views respectively illustrating sequential steps of a method for forming a pattern used in inspecting process defects occurring in a semiconductor device in accordance with the present invention. In this case, the substrate is comprised of a semiconductor substrate.

In accordance with this method, an etchable material layer such as an oxide film, nitride film or other material layer is coated over a semiconductor substrate 10, thereby forming a first etchable layer 11A. A positive photoresist film 12 is then coated over the first etchable layer 11A. Subsequently, the positive photoresist film 12 is selectively exposed to light using a light exposure mask 1 which has the structure of FIG. 1 provided with lines/spaces having the same dimension. The photoresist film 12 is then developed, thereby forming patterns of the positive photoresist film 12.

Figure 4A:
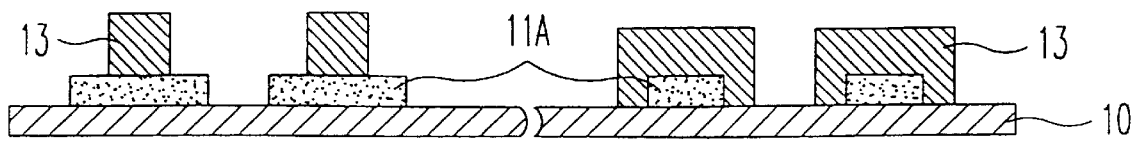
FIGS. 4A to 4E are sectional views respectively illustrating sequential steps of a method for forming a pattern used in inspecting process defects occurring in a semiconductor device in accordance with the present invention.

Although the light exposure mask 1 has photo shield film patterns having the same dimension, the positive photoresist film patterns have different dimensions at different positions thereof respectively corresponding to different portions of the field region of the light exposure mask 1, for example, the central and edge portions C and E of the field region due to a difference in critical dimension involved in the light exposure mask 1. This is best shown in FIG. 4A.

Thereafter, portions of the first etchable layer 11A not covered with the patterns of the positive photoresist film 12 are removed using those patterns as a mask, thereby forming patterns of the first etchable layer 11A. The remaining positive photoresist film 12 is then completely removed.

Over the entire upper surface of the resulting structure, a negative photoresist film 13 is then coated. The negative photoresist film 13 is then selectively exposed to light using the light exposure mask 1 shown in FIG. 1 for its patterning.

The light exposure for the negative photoresist film 13 is carried out under the condition in which the light exposure mask 1 is misaligned from the semiconductor substrate 10 in a direction perpendicular to the longitudinal direction of patterns by a distance corresponding to "(n+½)×pitch" (n: a natural number). After developing the negative photoresist film 13, patterns of the negative photoresist film 13 are obtained which have a large dimension enough to completely cover associated patterns of the first etchable layer 11A at the central portion C of the field region and a small dimension enough to expose opposite lateral edges of patterns of the first etchable layer 11A at the edge portion E of the field region. This is best shown in FIG. 4A. The misalignment distance can be optionally adjusted. In the case of forming line/space patterns, the misalignment distance corresponds to either "(n+½)×pitch" or "(n+¼)×pitch" (n: a natural number). In this case, the line/space patterns of the light exposure mask have a dimension satisfying the equation: $S=L\times n$ (S: the dimension of each space of the line/space patterns; L: the dimension of each line of the line/space patterns; and n: a natural number (n=1,2,3...)).

Figure 4B:
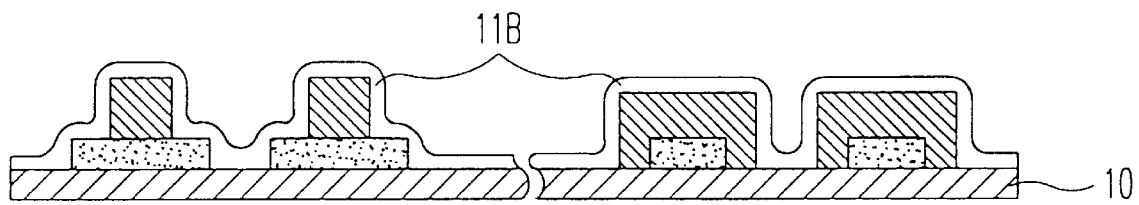

Subsequently, a second etchable layer 11B is coated over the entire upper surface of the resulting structure, as shown in FIG. 4B. The second etchable layer 11B is made of a material exhibiting a high etch selectivity to the first etchable layer 11A, for example, TiN or WSi, so as to obtain a high etch selectivity upon conducting a subsequent etch process.

Figure 4C:
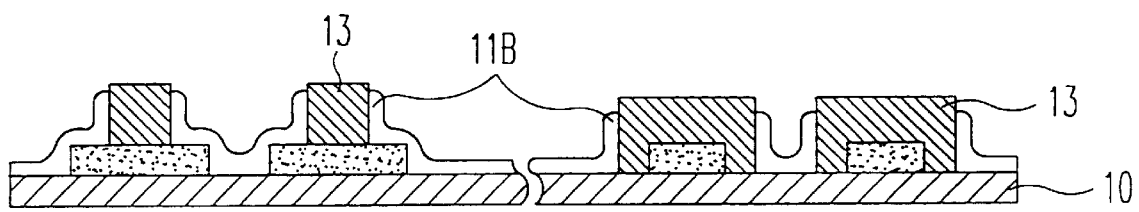

Thereafter, portions of the second etchable layer 11B respectively disposed over the patterns of the negative photoresist film 13 are removed in accordance with an appropriate method such as a full-surface anisotropic etch method, as shown in FIG. 4C. As a result, patterns of the second etchable layer 11B are formed which expose upper surfaces of the negative photoresist film patterns.

Figure 4D:
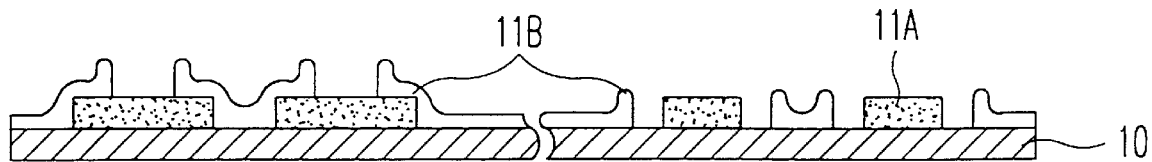
Figure 4E:

The patterns of the negative photoresist film 13 are then completely removed, thereby exposing patterns of the first etchable layer 11A disposed beneath the negative photoresist film patterns, as shown in FIG. 4D. Subsequently, the exposed portions of the first etchable layer 11A are removed. As a result, the first etchable layer 11A is partially left in the form of remaining layers having a small dimension at the edge portion E of the field region where it overlaps with the patterns of the second etchable layer 11B. This is best shown in FIG. 4E.

For the resulting structure having the above-mentioned structure, an inspection of process defects is then conducted using a defect inspection device. That is, the defect inspection device measures positions, density and dimensions of the remaining layer portions of the first etchable layer 11A. Accordingly, it is possible to measure the difference in critical dimension of the patterns at different positions in the field region. It is also possible to easily determine areas where a compensation is required. In order to achieve an easy inspection, the first etchable layer 11A is made of a material exhibiting a high reflection factor, for example, aluminum, so that it can be detected by the defect inspection device.

The difference in etch selectivity between the first etchable layer 11a and substrate may increase by forming an additional etchable layer comprised of a boro phospho silicate glass (BPSG) film, oxide film or nitride film beneath the first etchable layer 11A to a thickness of about 100 to 1,000 Å.

Meanwhile, although not shown, the defect inspection device utilizing the principle of optics includes a light source emitting light beams. These light beams are fed along a desired optical path and then irradiated onto a wafer on which patterns of an etchable layer are formed. A signal sensor unit senses the light beams reflecting from the wafer in the form of pattern images.

For each pattern image of the wafer sent to the signal sensor unit, its lightness/darkness or color index is then derived based on the reflection index of the pattern image. The data about color index as obtained in the above-mentioned manner are converted into corresponding electrical signals having values ranging from 0 to 255. Among the pattern images, those having a lightness/darkness difference beyond a predetermined value, namely, a threshold value, are associated with patterns requiring a compensation, respectively.

As mentioned above, patterns of an etchable layer are formed on a semiconductor substrate in such a manner that a light exposure mask having lines/spaces with a certain pitch is misaligned with the semiconductor substrate. Where a contact hole mask is used, however, it is possible to measure a difference in critical dimension of patterns caused by the proximity effect without requiring a misalignment between the light exposure mask and semiconductor substrate upon forming patterns of a negative photoresist film. In this case, ring-shaped patterns of an etchable layer are formed around portions of the semiconductor substrate where contact holes will be formed, respectively.

As apparent from the above description, the present invention provides a method for inspecting process defects occurring in a semiconductor device, which utilizes the phenomenon that even when photo shield film patterns are used, patterns of an etchable layer have different dimensions at different positions in the field region. In accordance with the present invention, a first etchable layer formed over a semiconductor substrate and then patterned using patterns of a positive photoresist film which are formed by use of a light exposure mask. Patterns of a negative photoresist film is then formed on the first etchable layer under the condition in which the substrate is misaligned from the light exposure mask by a distance corresponding to either "(n+½)×pitch" or "(n+¼)×pitch" (n: a natural number) upon conducting a secondary light exposure for the formation of those patterns. The first etchable layer is then patterned using the negative photoresist film patterns in the form of remaining layers. The defect inspection device measures positions, density and dimensions of the remaining layer portions of the first etchable layer. Accordingly, it is possible to quantitatively measure the difference in critical dimension of the patterns at different positions in the field region. The measured values are fed back to correct an error occurring in the photo shield film patterns of the light exposure mask. Accordingly, it is possible to reduce the time taken for the inspection of process defects. This results in an improvement in process yield and operation reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for inspecting process defects occurring in a semiconductor deice, comprising:

a) forming a first etchable layer over a semiconductor substrate;

b) forming a positive photoresist film over the first etchable layer;

c) exposing the positive photoresist film to light by use of a light exposure mask having line/space patterns of a photo shield film, thereby forming patterns of the positive photoresist film in such a manner that the positive photoresist film patterns have different dimensions at different positions in a field region by virtue of a proximity effect;

d) etching the first etchable layer by use of the positive photoresist film patterns as a mask, thereby forming patterns of the first etchable layer;

e) removing the positive photoresist film patterns;

f) forming a negative photoresist film over the entire upper surface of the resulting structure obtained after the removal of the positive photoresist film patterns;

g) shifting the light exposure mask by a desired distance in such a manner that the shield photo film patterns are misaligned from corresponding first etchable layer patterns by a misalignment distance corresponding to either (n+0.5)×p or (n+0.25)×p, wherein "n" is a natural number and "p" is a pitch of the line/space patterns of the photo shield film;

h) exposing the negative photoresist film so as to form patterns of the negative photoresist film that are based on the misaligned photo shield film patterns of the light exposure mask;

i) forming patterns of a second etchable layer exhibiting a difference in etch selectivity from the first etchable layer, while partially exposing the negative photoresist film patterns;

j) removing the exposed negative photoresist film patterns, thereby exposing portions of the first etchable layer disposed beneath the removed negative photoresist film patterns;

k) removing the exposed portions of the first etchable layer, thereby leaving the portions of the first etchable layer disposed beneath the second etchable layer patterns as remaining layers;

l) removing the second etchable layer patterns; and m) inspecting the resulting structure obtained after the removal of the second etchable layer patterns to detect the remaining layers to inspect the density and dimensions of the detected remaining layer, thereby calculating a difference in critical dimension involved in the light exposure mask based on the result of the inspection.

2. The method in accordance with claim 1, further comprising the step of forming an additional etchable layer comprised of a boro phospho silicate glass, oxide film and nitride film beneath the first etchable layer to a thickness of 100 to 1,000 Å to increase the difference in etch selectivity between the first etchable layer and the substrate.

3. The method in accordance with claim 1, wherein the first etchable layer is comprised of an oxide film, nitride film or metal layer.

4. The method in accordance with claim 3, wherein the first etchable layer is made of aluminum exhibiting a high reflection factor so that a subsequent defect inspection process can be easily conducted.

5. The method in accordance with claim 1, wherein the line/space patterns of light exposure mask have a dimension satisfying the following equation:

$$S = L \times n$$

where,

L: the dimension of each line;

S: the dimension of each space; and n: a natural number (n:1, 2, 3 . . . ).

6. The method in accordance with claim 1, wherein when the photo shield film patterns of the light exposure mask have contact hole patterns, the formation of the negative photoresist film patterns is conducted without using the misalignment of the light exposure mask.

7. The method in accordance with claim 1, wherein the second etchable layer is made of TiN or WSi.

* * * * *